(12) United States Patent
Saito et al.

(10) Patent No.: US 6,663,706 B2
(45) Date of Patent: Dec. 16, 2003

(54) RAW MATERIAL COMPOUNDS FOR USE IN CVD, AND CHEMICAL VAPOR DEPOSITION FOR PRODUCING IRIDIUM OR IRIDIUM COMPOUND THIN FILMS

(75) Inventors: Masayuki Saito, Hiratsuka (JP); Takeyuki Sagae, Hiratsuka (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 10/413,516

(22) Filed: Apr. 15, 2003

(65) Prior Publication Data

US 2003/0207552 A1 Nov. 6, 2003

(30) Foreign Application Priority Data

May 1, 2002 (JP) ..................................... P2002-129502

(51) Int. Cl.[7] ............................. C09K 3/00; B05D 5/12; B05D 3/02; C23C 16/40; C07F 15/00
(52) U.S. Cl. .................... 106/287.18; 556/40; 556/136; 427/124; 427/126.5; 427/227; 427/585; 427/593; 106/287.24
(58) Field of Search .............. 556/40, 136; 106/287.24, 106/287.18; 427/124, 126.5, 227, 585, 593

(56) References Cited

U.S. PATENT DOCUMENTS 6,258,157 B1 * 7/2001 Gordon .................. 106/287.24
6,504,070 B2 * 1/2003 Matsumoto et al. ........ 585/457
6,512,297 B2 * 1/2003 Matsuno et al. ............ 257/768

FOREIGN PATENT DOCUMENTS

JP 08-085873 4/1996
JP 11-292888 10/1999

OTHER PUBLICATIONS

Sun, Y.–M., et al, "Precursor chemistry and film growth with (methylcyclopentadienyl)(1,5–cyclooctadiene)iridium", J. Vac. Sci Technol, A, vol. 18, No. 1, Jan./Feb. 2000.

* cited by examiner

Primary Examiner—Porfirio Nazario-Gonzalez
(74) Attorney, Agent, or Firm—Rothwell, Figg, Ernst & Manbeck

(57) ABSTRACT

This invention provides raw material compounds for use in CVD which contain an organic iridium compound as a main ingredient, the organic iridium compound consisting of tris(5-methyl-2,4-hexanedionato)iridium. According to the CVD which uses the above raw material compounds, a pure iridium thin film and an iridium oxide thin film of excellent morphology can be produced effectively.

2 Claims, No Drawings

RAW MATERIAL COMPOUNDS FOR USE IN CVD, AND CHEMICAL VAPOR DEPOSITION FOR PRODUCING IRIDIUM OR IRIDIUM COMPOUND THIN FILMS

BACKGROUND OF THE INVENTION

1. Field of the Invention

This invention relates to raw materials for use in production of an iridium or iridium compound thin film by CVD and a method for producing the same.

2. Description of the Related Art

In recent years, noble metals such as iridium and ruthenium have been applied as materials for thin film electrodes used in a variety of semiconductor devices. This is because noble metals have low resistivity and exhibit excellent electric properties when they are formed into electrodes. In particular, iridium and the oxides thereof have been used as upper and lower electrodes of FeRAM.

As a method for producing thin films used in thin film electrode applications, while sputtering is widely in use, the application of chemical vapor deposition (hereinafter referred to as CVD) has been examined in recent years. The reason for this is that CVD makes easier the production of uniform thin films, in addition, it is superior to sputtering in step coverage. Furthermore, as a technique for increasing the capacity of memory devices such as DRAM and FeRAM, it is being attempted to provide thin films with three-dimensional multilayer structure, instead of the conventional two-dimensional multilayer structure; however, to form such a complex electrode structure, the technique is required to have stricter step coverage and process controllability than those of the conventional ones. In terms of these demands, CVD has attracted considerable attention.

Known compounds, which are used as raw materials for iridium film or iridium compound thin films produced by CVD, come in two general types, cyclooctadiene iridium compounds and β-diketone iridium compounds.

Cyclooctadiene iridium compounds consist of: iridium; and a cyclooctadiene and a cyclodiene derivative coordinated therewith, and as raw materials for use in CVD, are known, for example, methylcyclopentadienyl(1,5-cyclooctanedione)iridium and ethylcyclopentadienyl(1,5-cyclooctanedione)iridium having the following formula:

[Chemical Formula 1]

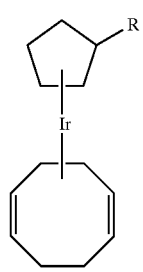

(wherein R is any one selected from the group consisting of hydrogen, a methyl group and an ethyl group.)

The cyclooctadiene iridium compounds are preferable as CVD raw materials in terms of its handling properties because they have low melting points (about 25° C. to 125° C.), and ethylcyclopentadienyl(1,5-cyclooctanedione) iridium is particularly preferable because it is in the liquid state at room temperature (for further details of the cyclooctadiene iridium compounds, refer to Japanese Patent Laid-Open No. 11-292888, J. Vac. Sci. Technol. A18(1) 10–16 (2000)).

On the other hand, β-diketone iridium compounds consist of: iridium; and β-diketone organic compounds coordinated therewith. And as raw materials for use in CVD, some β-diketone organic iridium compounds having the following formula are disclosed in Japanese Patent Laid-Open No. 8-85873:

[Chemical Formula 2]

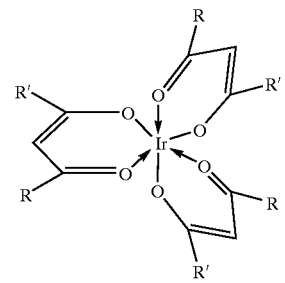

(wherein R, R' are independently selected from the group consisting of $CH_3$, CF, $CF_3$, $C_2H_5$, $C_2F_5$, $C_3H_7$, $C_3F_7$ and $C(CH_3)_3$.)

While many of the above β-diketone iridium compounds are in the solid state at room temperature, though it depends on the types of substituents R, R', they are considered to be very advantageous when producing thin films by CVD through sublimation thereof. This is because they are highly subliming, their vapor pressures at moderate and low temperatures are high, and there is a clear gap between their vaporization temperatures and decomposition temperatures. Some of the above β-diketone iridium compounds (tris(2,4-heptanedionato)iridium wherein R=a methyl group and R'=a propyl group, and tris(2,2-dimethyl-3,5-hexanedionato)iridium wherein R=a methyl group and R'=an isobutyl group) are liquid, and these compounds can be formed into thin films by ordinary vaporizing means. Further, the above β-diketone iridium compounds has the advantages that they are highly reactive with oxygen and they can be formed into both pure iridium thin films and iridium oxide thin films by controlling the oxygen concentration, and the morphology of their thin films is good.

However, according to the inventors of this invention, the known organic iridium compounds have the problems described below in respect to the industrial production efficiency and application scope of iridium thin films.

First, the cyclooctadiene iridium compounds are good in handling properties because they are in the liquid state at room temperature. However, they have a problem of being unable to produce iridium oxide thin films, but producing only pure iridium thin films even if film formation is performed in an oxygen atmosphere, because they are not very reactive with oxygen. Taking into consideration the fact that it is iridium oxide whose application to FeRAM thin film electrodes are under consideration at present, it has to be said that the application scope of the cyclooctadiene iridium compounds is limited.

On the other hand, the application scope of the β-diketone iridium compounds is not a problem. However, many of the β-diketone iridium compounds are in the solid state at room temperature, therefore, they have to be formed into thin films using a sublimation technique; but, it is relatively difficult to control the amount of the compounds vaporized through sublimation to a fixed value, since vaporization using a sublimation technique is an unstable process. Further, even if the amount of the compounds vaporized is controlled, it is difficult to keep the vaporized compounds in the gas state, and the raw material gases can sometimes be brought to the solid state during the process of carrying them from their container to a substrate, resulting in their adhesion to the inside of piping. This may cause an unstable film forming rate and deterioration of thin film morphology.

As aforementioned, some β-diketone iridium compounds are in the liquid state at room temperature, and these can be formed into thin films without using a sublimation technique. However, in the known liquid β-diketone iridium compounds, their vapor pressures are low, therefore, their thin film production efficiency is low, and to ensure a certain production efficiency, it is necessary to increase the heating temperature during thin film production. If, however, the vaporization temperature is increased higher than necessary, the raw material compounds tend to decompose even in an inert atmosphere. Therefore, when producing their thin films using a large volume of raw material gases, it is difficult to control the heating of the raw material gases. Thus, the liquid β-diketone iridium compounds are unfit for production of thin films on large-sized substrates and for mass production.

Recently, in the field of CVD, in light of the low use efficiency (the ratio of introduced raw material compounds to those actually contributing to thin film forming reaction) in CVD, application of a recycling technique, in which used raw materials are collected so as to recover unreacted raw materials therefrom, has been examined. This recycling technique consists of: a step of collecting used raw material compounds (gases) discharged from a reactor while bringing the same to the liquid state with a cold trap etc.; and a step of separating/purifying unreacted compounds from the collected compounds by distillation etc. This recycling is, however, difficult to apply to the β-diketone iridium compounds. The reason is that, in the solid β-diketone iridium compounds, it is difficult to recover them in the liquid state and it is impossible to purify them by distillation. In the liquid β-diketone iridium compounds, it is difficult to separate/purify them by distillation etc. because their vapor pressures are low. Thus CVD in which recycling is taken into consideration is difficult to apply to the known β-diketone iridium compounds; as a result, costs for producing thin films using these compounds rise.

To summarize the problems described so far, the raw material compounds for use in CVD to produce iridium or iridium compound thin films are required first to be in the liquid state at room temperature, in addition, to have high vapor pressures and high reactivity with oxygen. This invention has been made in light of the above background. Accordingly, the object of this invention is to provide raw material compounds for use in CVD to produce iridium or iridium compound thin films, in particular, to provide iridium compounds as raw materials for use in CVD, which have the above required properties, to produce iridium or iridium compound thin films, and a method for producing the same.

SUMMARY OF THE INVENTION

To solve the above described problems, the inventors first examined the problem of poor reactivity with oxygen; as a result, it was verified that to ensure the reactivity with oxygen, it was preferable to coordinate a β-diketone, as a ligand, with iridium. Although the reasons for this are not necessarily clear yet, the inventors considered that the reactivity with oxygen depended on the Ir—O bonds which β-diketones had in their molecules.

Then, the inventors made an examination as described below to verify whether or not there are some publicly unknown compounds which belong to β-diketone iridium compounds, but are in the liquid state at room temperature and have high vapor pressures.

First, as to the state of the compounds at room temperature, according to the examination by the inventors, as the molecular weight of their ligands becomes high, the state of the compounds tends to shift from the solid state to the liquid state, at the same time, the viscosity of the liquids tends to be low. The reason for this may be that while ordinary β-diketone iridium compounds exist in state where cis- and trans-forms are mixed, as the molecular weight of their substituents is increased, the crystallinity between the two isomers is lowered. Accordingly, if greater importance is attached to the state at room temperature, ligands having higher molecular weights should be coordinated with iridium.

On the other hand, the molecular weight of the ligands also affects the vapor pressures of the compounds. According to the inventors, the higher the molecular weight, the lower the vapor pressure. Accordingly, to obtain the compounds having higher vapor pressures, it is required to coordinate ligands having lower molecular weight with iridium; and this is incompatible the aforementioned requirement. In other words, as long as attention is focused on the molecular weight of the compounds alone, it is difficult to obtain compounds this invention aims at.

Then, the inventors further examined the structure of β-diketones as ligands, in addition to the magnitude of their molecular weights, and found that among the compounds consisting of iridium and β-diketones coordinated therewith and having the same molecular weight, those including β-diketones whose substituents (R, R') are of different types from each other and one of which has a branched chain (in other words, those including asymmetrical β-diketones having a branched chain substituent) have higher vapor pressures. And based on the above requirements, the inventors found tris(5-methyl-2,4-hexanedionato)iridium as a preferable β-diketone iridium compound, and they finally thought of this invention.

Specifically, this invention is raw material compounds for use in CVD which have an organic iridium compound as a main ingredient, the organic iridium compound consisting of tris(5-methyl-2,4-hexanedionato)iridium shown by the following formula:

[Chemical Formula 3]

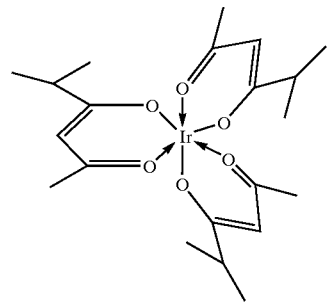

The compound, tris(5-methyl-2,4-hexanedionato)iridium, is one form of β-diketone iridium compounds in which β-diketones are coordinated with their iridium, and iridium oxide can be deposited form the compound by reacting the same in an oxygen atmosphere, because the compound is highly reactive with oxygen. Accordingly, the iridium compound of this invention is suitable as a raw material used in production of an iridium oxide thin film and has a wider application scope compared with the conventional cyclooctadiene iridium compounds.

The compound, tris(5-methyl-2,4-hexanedionato)iridium, of this invention includes coordinated. β-diketones which have relatively high molecular weights, and the coordinated β-diketones being asymmetrical ligands whose two substituents are a methyl group and an isopropyl group having a branched chain. With such coordinated β-diketones, the organic iridium compound of this invention can be in the liquid state at room temperature and has a relatively high vapor pressure. Thus, it permits production of a thin film without using a sublimation technique and permits the production to be highly efficient because it is easily vaporized. Furthermore, it can be recycled because it is a liquid having a high vapor pressure.

The compound, tris(5-methyl-2,4-hexanedionato)iridium, of this invention can be prepared by reacting iridium compounds, such as iridium chloride, with 5-methyl-2,4-hexanedione in a solvent. As the iridium compound, iridium chloride is preferable from the viewpoint of reactivity, and as a solvent, water is preferable. And this reaction system requires that an alkali hydrogencarbonate such as for example potassium hydrogencarbonate be added thereto. The reason for the addition of an alkali hydrogencarbonate is to adjust the pH of the reaction system and allow the reaction of the iridium compound with 5-methyl-2,4-hexanedione, as a neutralization reaction, to progress. The pH range of this reaction system is preferably the alkali range, particularly preferably 7 to 9. In the acid range where pH is less than 7, the synthesis reaction does not progress, resulting in low yield of tris(5-methyl-2,4-hexanedionato) iridium. The reason for setting the maximum pH in the alkali range for 9 is that if the pH is more than 9, the reaction rate begins to decrease, also resulting in low yield of tris(5-methyl-2,4-hexanedionato)iridium. Preferably the reaction temperature and time are 90 to 100° C. and 3 to 10 hours, respectively.

Since there exists an unreacted iridium compound in the reaction solution after the reaction, extraction is performed to remove such an unreacted iridium compound. In the extraction process, tris(5-methyl-2,4-hexanedionato)iridium is extracted in an extractant by bringing the extractant into contact with the reaction solution; and as the extractant, preferably hexane is used. Preferably this extraction process is repeated so that tris(5-methyl-2,4-hexanedionato)iridium is recovered completely from the reaction solution.

On the other hand, there exists an unreacted 5-methyl-2, 4-hexanedione in an extraction solvent obtained in the extraction process, and it is necessary to remove the unreacted 5-methyl-2,4-hexanedione. As a process for removing the unreacted 5-methyl-2,4-hexanedione, distillation (vacuum distillation) is suitably used so as to effectively purify and recover tris(5-methyl-2,4-hexanedionato)iridium. Preferably this distillation treatment is performed by vacuum distillation at pressures of $4\times10^3$ to $5\times10^3$ Pa (30 to 40 mmHg) and temperatures of 80 to 90° C.

Lastly, a method for forming thin films which applying CVD raw materials containing tris(5-methyl-2,4-hexanedionato)iridium of this invention as a main ingredient. The method for forming thin films is basically the same as the general type of CVD. Specifically, the method includes the steps of: vaporizing a raw material compound for use in CVD; carrying the vaporized raw material compound on a substrate; and decomposing the same so that iridium or a iridium compound is deposited on the substrate.

As to the vaporization of the raw material compounds, since the organic iridium compounds of this invention can be in the liquid state at room temperature, it may be performed by directly heating the compounds or by dissolving the compounds in proper solvents and heating the solution. In the latter case, as a solvent are used organic solvents such as methanol, ethanol, propanol, isopropanol and tetrahydrofuran.

As to the system of vaporizing the raw materials, there are two types: one in which the raw materials stored in a raw material container are bubbled while heated; and the other in which the raw materials stored in a raw material container are heat vaporized with a vaporizer. Any of the above types are applicable to the compounds of this invention. However, to produce thin films in a more stable manner, the system using a vaporizer is preferable. As to the heating temperature at the time of raw material vaporization, preferably it is 80 to 150° C. when heating the raw materials directly.

The methods for decomposing the raw material molecules having been vaporized and carried on the substrate surface are not limited to any specific ones, and any methods such as thermal CVD and plasma enhanced CVD can be employed. The thermal CVD is particularly preferable, because the system is simple and there is no concern about damage to the substrate since the decomposition temperature of the raw materials of this invention is relatively low. Preferably the iridium compounds are decomposed at substrate temperatures of 250° C. to 550° C.

In this CVD process, preferably a reduced pressure atmosphere is maintained inside the reactor. Reducing the pressure inside the reactor provides satisfactorily uniform film distribution and good step coverage. The preferable range of the pressure inside the reactor is 10 to 1000 Pa.

DETAILED DESCRIPTION OF THE PREFERRED EMBODIMENTS

In the following this invention will be described in terms of its preferred embodiments.

Preparation of Tris(5-methyl-2,4-hexanedionato) iridium 10.0 g of iridium chloride trihydrate (27.29 mmol, iridium content 52.46%), 10.77 g (84.77 mmol) of 5-methyl-2,4-hexadione, and water as a solvent were put into a separable flask and heated under reflux at 93 to 95° C. for 4 hours, after that, potassium hydrogencarbonate was added to the solution so that the pH of the solution becomes 8.0 (the addition weight was 11.18 g). The solution was further heated under reflux at 93 to 95° C. for 5 hours to make the reaction progress.

The reaction solution was shifted to a separatory funnel and extracted with 10% solution of sodium hydroxide/hexane. The extracting operation was repeated 4 to 5 times until the hexane layer became transparent. The weight of the extracted solution thus obtained was reduced with a rotary evaporator, the solution was re-extracted with water, and magnesium sulfate anhydride was added to the extracted solution (the hexane layer) to dehydrate the same. After the dehydration treatment, the extracted solution was filtered under suction to remove magnesium sulfate and concentrated with a rotary evaporator. Then, to remove 5-methyl-2,4-hexadione from this extracted solution, the solution was subjected to vacuum distillation at 4000 Pa, 80° C., and the distilled solution was purified by distillation at 2.7 Pa, 120° C. to produce a reddish yellow liquid.

The reddish yellow liquid thus obtained was examined by GCMS and IR analysis, and it was verified that the reddish yellow liquid was tris(5-methyl-2,4-hexanedionato)iridium. The compound, tris(5-methyl-2,4-hexanedionato)iridium, was in the liquid state at room temperature and its vaporization temperature was found to be 105° C. by differential thermal analysis.

Production of Iridium Thin Film

An iridium thin film was produced by CVD from tris(5-methyl-2,4-hexanedionato)iridium, as a raw material, which had been prepared through the above described process. The reaction conditions in the CVD process were set as follows. To vaporize the raw material, a system was adopted in which tris(5-methyl-2,4-hexanedionato)iridium was dissolved in methanol and the raw material solution was heat vaporized with a vaporizer.

Concentration of Raw Material Solution: 0.5 mol/L
Raw Material Solution Feed Rate: 0.1 mL/min
Vaporization Temperature: 180° C.
Carrier Gas: argon (200 sccm)
Reaction Gas: oxygen (50 sccm)
Chamber Pressure: 133 Pa (1 torr)
Substrate: SiO$_2$ wafer
Substrate Temperature: 270° C.
Film Formation Time: 15 minutes By the X-ray diffraction analysis conducted for the thin film thus obtained, it was verified that the thin film was a pure iridium thin film. The morphology of the thin film was examined with an AFM (atomic force microscope). It was verified from the result that the thin film had a surface roughness $R_{MS}$=2.3 nm and that films of satisfactory morphology could be produced.

Production of Iridium Oxide Thin Films

An iridium oxide thin film was produced from tris(5-methyl-2,4-hexanedionato)iridium prepared described above, as a raw material. The reaction conditions in the CVD process were set as follows.

Concentration of Raw Material Solution: 0.5 mol/L
Raw Material Solution Feed Rate: 0.1 mL/min
Vaporization Temperature: 180° C.
Carrier Gas: argon (200 sccm)
Reaction Gas: oxygen (200 sccm)
Chamber Pressure: 133 Pa (1 torr)
Substrate: SiO$_2$ wafer
Substrate Temperature: 270° C.
Film Formation Time: 15 minutes By the X-ray diffraction analysis conducted for the thin film obtained, it was verified that the film was an iridium oxide thin film. The morphology of the thin film was examined with an AFM (atomic force microscope). It was verified from the result that the film had a surface roughness $R_{MS}$=3.8 nm and that films of satisfactory morphology could be produced.

As described so far, it was verified that both pure iridium and iridium oxide thin films could be produced by using tris(5-methyl-2,4-hexanedionato)iridium prepared in the embodiment of this invention. It was also verified that the morphology of the thin films thus produced were satisfactory.

What is claimed is:

1. Raw material compounds for use in CVD which contains an organic iridium compound as a main ingredient, wherein the organic iridium compound consists of tris(5-methyl-2,4-hexanedionato)iridium having the following structural formula:

[Chemical Formula 1]

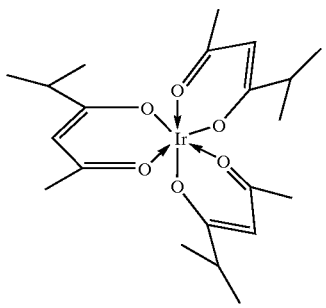

2. A chemical vapor deposition for producing an iridium or iridium compound thin film, comprising the steps of: vaporizing the raw material compounds according to claim 1 which are for use in CVD; carrying the vaporized raw material compounds on a substrate; and decomposition the same to deposit iridium or an iridium compound on the substrate.

* * * * *